United States Patent [19]

Ohyu et al.

[11] Patent Number: 4,742,025

[45] Date of Patent: May 3, 1988

[54] METHOD OF FABRICATING A SEMICONDUCTOR DEVICE INCLUDING SELECTIVE ETCHING OF A SILICIDE LAYER

[75] Inventors: Kiyonori Ohyu, Hachioji; Nobuyoshi Natsuaki, Higashiyamato; Msao Tamura, Tokorozawa; Yasuo Wada, Bunkyo, all of Japan

[73] Assignee: Hitachi, Ltd., Tokyo, Japan

[21] Appl. No.: 795,271

[22] Filed: Nov. 5, 1985

[30] Foreign Application Priority Data

Nov. 5, 1984 [JP] Japan ............................ 60-231412

[51] Int. Cl.$^4$ .................. H01L 21/283; H01L 21/326
[52] U.S. Cl. ................................. 437/225; 437/985; 437/200; 437/245; 437/238; 204/42
[58] Field of Search .................... 29/591, 590, 589; 148/1.5; 357/49; 156/653, 643, 628; 204/56.1, 57, 58, 58.5, 38.4, 15, 42; 437/225, 228, 238, 245, 200

[56] References Cited

U.S. PATENT DOCUMENTS 4,432,035 2/1984 Hsieh et al. .......................... 361/322
4,589,056 5/1986 Stimmell ............................. 361/311

OTHER PUBLICATIONS

Tsai et al., "One-Micron Polycide", in *J. Electrochem. Soc.* Oct. 1981, vol 128, No. 10, pp 2207-2214.
Murarka, S. P. "Refractory Silicides for ICs" in J. Vac. Sci. Tech. vol. 17. No. 4, Jul./Aug. 1980, pp. 775-792.
Murarka, S. P., Silicides for VLSI Applications, Academic Press, 1983, TK 7871.15 554 1982, pp. 134-139.
Ghandhi, S. K., VLSI Fabrication Principles, John Wiley & Sons, 1983 pp. 400-411, 492-495.
Inoue et al. "Oxidation of Sputtered WSi$_2$", in Appl. Phys. Lett. 33(9), Nov. 1978, pp. 826-827.
Ho et al., "Selective Anodic Oxidation of Silicon", IEEE Trans. on Electron Devices, vol. ED. 27, No. 8, Aug. 1980, pp. 1436-1443.
d'Heurle et al. "Oxidation of Silicide Thin Films: TiSi$_2$", in *Appl. Phys. Lett. 42(4)*, Feb. 15, 1983, pp. 361-363.
Zinnsky et al., "Oxidation Mechanisim in WSi$_2$ Templates", in *Appl. Phys. Lett. 33(1)*, Jul. 1, 1978, pp. 76-29.

*Primary Examiner*—Brian E. Hearn
*Assistant Examiner*—T. N. Quach
*Attorney, Agent, or Firm*—Antonelli, Terry & Wands

[57] ABSTRACT

A desired portion of a refractory metal silicide film is oxidized by anodic oxidation to form oxides of silicon and of metal. The oxides formed are completely removed by etching. By so doing, the desired portion of the silicide film can be etched selectively without badly damaging an underlying silicon substrate or silicon dioxide film. Therefore, it is possible to easily affect patterning of the silicide film used for electrodes of MOS transistors and bipolar transistors as well as resistors and interconnections.

13 Claims, 4 Drawing Sheets

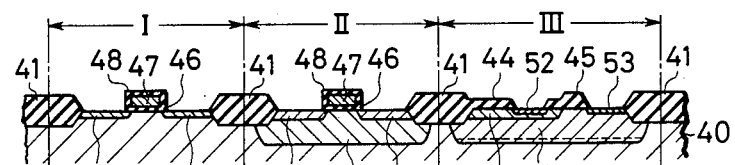
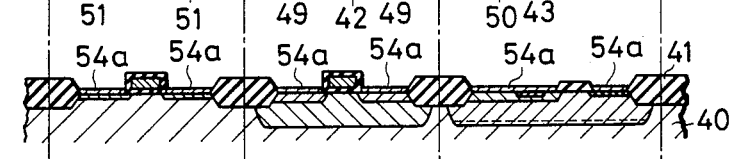
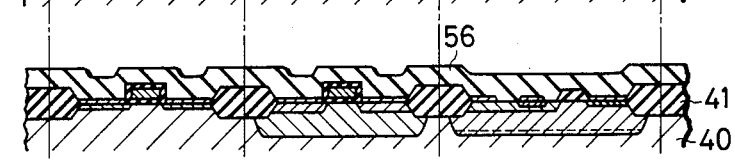
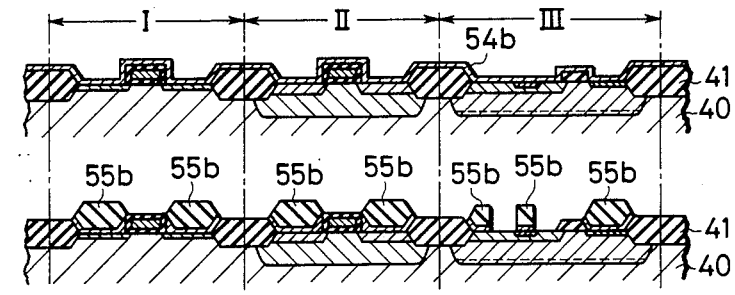

METHOD OF FABRICATING A SEMICONDUCTOR DEVICE INCLUDING SELECTIVE ETCHING OF A SILICIDE LAYER

BACKGROUND OF THE INVENTION

The present invention relates to a method of fabricating a semiconductor device. More particularly, it is concerned with a method of fabricating a semiconductor device capable of selectively etching and thereby removing a film formed from a silicide of a metal selected from various metals.

As well known, with improvement in integration density of a semiconductor integrated circuit, silicides of various metals, including tungsten, molybdenum, platinum, palladium and tantalum, have come to be used. However, the etching rates of these silicides are not so greatly different from the etching rates of single-crystalline silicon, polycrystalline silicon and silicon dioxide, so it has been difficult to selectively remove a desired portion of a silicide film and accurately form electrodes and interconnection in a semiconductor device.

For example, where a desired portion of a silicide film formed on a single-crystalline silicon substrate is to be selectively removed by etching, it is necessary to perform an overetching in order to effect etching completely. In this case, however, since single-crystalline silicon and silicide are not so different in etching rate as mentioned above, even the single-crystalline silicon substrate of the portion exposed after removal of the silicide film is etched to a remarkable extent.

Heretofore, as the method of selectively removing a silicide film, there has been used (1) a method of removing an unnecessary silicide film portion according to a lift-off process or (2) a method in which the etching rate of a silicide film under predetermined conditions is measured in advance and a desired portion of silicide is removed with reference to the measured value.

However, in the above method (1), it is likely that removed silicide pieces which have entered a resist removing solution during lift off will adhere as a foreign matter onto the surface of a substrate under treatment. Such an adhesion of a foreign matter may result in the semiconductor device being no longer able to fulfill its function. In the above lift-off method (1), moreover, it is necessary that the substrate temperature at the time of forming the silicide film be held not higher than 100° C. in order to prevent the generation of contaminant from the molten resist. At such a low temperature, however, even if there is made an attempt to form a silicide film by a chemical vapor deposition (CVD) or sputtering, it is impossible to form a uniform silicide film throughout the surface because of an extremely low coating ratio. Thus, it is very difficult to practically adopt the above method (1).

In the above method (2), in order to compensate for the non-uniformity of the silicide film thickness, there is performed an overetching for the purpose of completely removing a desired portion of the silicide film. In this case, there arises the problem that the silicon layer formed under the silicide film is also etched and removed. In the above method (2), moreover, there is fear of occurrence of the problem that the etching rate under the above etching condition differs markedly according to silicide film composition ratios.

As a reform measure for the method (2), the following method (3) is proposed in M. Y. Tsai et al, "One-Micron Polycide (WSi₂ on Poly-Si) MOSFET Technology" in J. Electrochem. Soc., vol. 128, 2207 (1981).

In the method (3), using a plasma etching process, the reaction gas flow rate is set to $CF_4:O_2 = 1:3$ (volume ratio) to thereby improve the etching selection ratio of silicide to silicon. It is described in the above literature that an etching rate selection ratio of $WSi_2$ to an n-type high concentration polycrystalline Si of about 4.5 is sometimes obtained. According to this method, even if a $WSi_2$ film is formed on an n-type high density concentration polycrystalline silicon film and the former is overetched, it is possible to remove a desired portion of $WSi_2$ selectively while somewhat suppressing etching of the underlying n-type high concentration polycrystalline silicon. However, the method (3) involves the following problems. The first problem is that optimum conditions for plasma etching differ according to silicide composition ratios. At present, for example the composition ratio of $WSi_2$ film varies in the range of $W:Si = 1:2-2.3$ according to silicide forming methods, so it is necessary to change etching conditions according to a change of the composition ratio.

The second problem is that if the substance present under the silicide film differs, for example like a p-type high concentration polycrystalline silicon, a non-doped polycrystalline silicon or a single-crystalline silicon, the foregoing selection ratio between the silicide film and the underlying substance differs depending on the kind of the underlying substance, thus making it difficult to etch only a desired portion of the silicide film selectively with a high accuracy.

The third problem is that a change of the reaction gas mixing ratio causes a great change of the etching selection ratio between the silicide film and the polycrystalline silicon, so it is difficult to etch a desired portion of the silicide film selectively while preventing damage of the undercoat.

Thus, various problems have been involved in the conventional methods for selectively removing the silicide film.

SUMMARY OF THE INVENTION

It is the object of the present invention to provide a method of fabricating a semiconductor device capable of solving the above conventional problems and selectively removing a desired portion of a silicide film without being influenced by the silicide film composition ratio and the kind of the material present under the silicide film.

According to the present invention, in order to achieve the above-mentioned object, a portion to be removed of a silicide film is oxidized by anodic oxidation and thereafter the oxide thereby formed is removed by etching, whereby the desired portion of the silicide film can be removed selectively without substantial etching of the undercoat.

BRIEF DESCRIPTION OF THE DRAWINGS

FIGS. 5a and 5b, FIGS. 6a to 6e, FIG. 7, FIGS. 8a to 8d and FIGS. 9a and 9b illustrate different embodiments of the present invention.

DETAILED DESCRIPTION OF THE PREFERRED EMBODIMENTS

Figure 1:
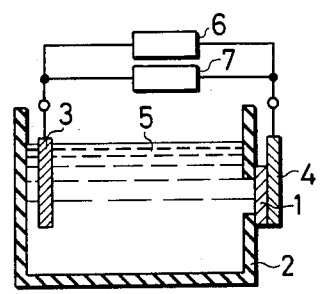
FIGS. 1, 2 and 3a to 3d are a schematic view, a curvilinear view and a process chart, respectively, for explaining the principle of the present invention.
Figure 2:
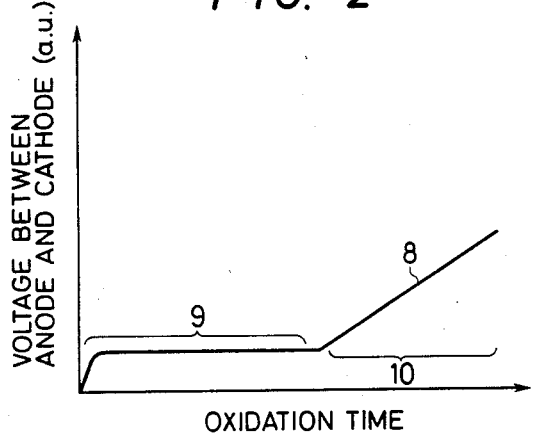

As shown in FIG. 1, a work piece 1 with a silicide film formed on the surface of a silicon substrate was brought into contact with an electrolytic solution 5 in an anodic oxidation vessel 2, and a cathode 3 and an anode 4 were connected to a constant current source 6 and an anodic oxidation was performed while keeping current constant. Changes of voltage between the cathode 3 and the anode 4 were measured by a voltmeter 7 and there was obtained such a voltage variation curve 8 as shown in FIG. 2.

The curve 8 can be separated into a portion 9 where the silicide is subjected to anodic oxidation and a portion 10 where the substrate is subjected to anodic oxidation. A large voltage variation is observed as the substrate begins to be oxidized after completion of the silicide film oxidation. For example, the resistivity of an oxide film of silicide formed by an anodic oxidation of a tungsten silicide film is not higher than $10^8 \Omega \cdot cm$, and the increase of resistance caused by this oxide film formation and the resulting voltage increase are very small. However, the resistivity of a silicon dioxide film formed by oxidation of a silicon substrate is $10^3 \Omega \cdot cm$ and thus much larger than the resistance of the above oxide film of silicide. Consequently, as the oxidation of silicon as the substrate starts after termination of the silicide film oxidation, the above voltage rises remarkably, so by stopping the anodic oxidation just after increase of voltage variation, the silicide film alone can be oxidized selectively.

Figure 3A:
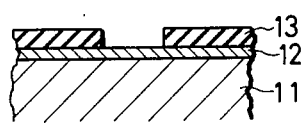
Figure 3B:
Figure 3C:
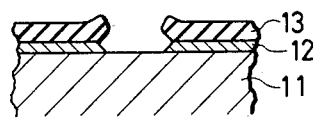
Figure 3D:
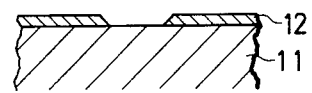

A desired portion of the silicide film can be selectively removed in the following manner. As shown in FIG. 3a, an insulating film 13 such as a photoresist film or a silicon dioxide or silicon nitride film is formed on a silicide film 12 which is formed on a substrate 11, and the insulating film 13 is removed only at a desired portion corresponding to the portion of the silicide film 12 to be removed. Then, an anodic oxidation is performed using the substrate 11 side as anode as shown in FIG. 1. During the anodic oxidation, voltage variations are monitored by the voltmeter 7 and the anodic oxidation is stopped upon sudden increase of voltage. By so doing, only the exposed portion of the silicide film is substantially oxidized with little oxidation of the substrate 11, and an oxide film 14 of silicide is formed selectively in an opening portion of the insulating film 13 as shown in FIG. 3b. Thereafter, the silicide oxide film 14 is removed with, for example, a hydrofluoric acid etchant as shown in FIG. 3c. Then, the insulating film 13 is removed as shown in FIG. 3d.

According to this method, the oxidation of the undercoat, for example, a silicon substrate can be suppressed to not more than 20 nm. Moreover, the same selectivity is ensured independently of the base substrate material such as, for example, a p- or n-type high concentration polycrystalline semiconductor, a non-doped polycrystalline semiconductor or a single-crystalline semiconductor. Further, even when the kind or composition ratio of silicide film changes, there is obtained such a time dependency of voltage variation as shown in FIG. 2.

Thus, the present invention is characterized in that a silicide film formed on a semiconductor substrate is selectively oxidized by an anodic oxidation process and thereafter the resulting oxide film of silicide is removed to thereby remove a desired portion of the silicide film selectively. Anodic oxidation of silicide results in formation of both silicon oxide and metal oxide, but both oxides are porous so can be etched with an etchant extremely easily. On the other hand, a silicon oxide formed by a thermal oxidation is much more dense and difficult to be etched, so only the oxide of silicide can be etched and removed selectively.

EXAMPLE 1

Figure 4A:
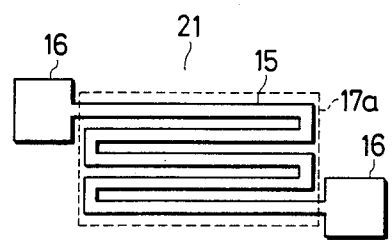
FIGS. 4a, 4b and 4c illustrate an embodiment of the present invention.
Figure 4B:
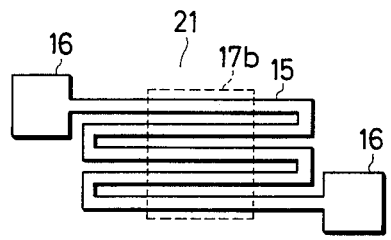

In this Example a silicide film was formed on an impurity-doped layer and there was prepared a resistor having a desired resistance value. FIGS. 4a and 4b are each a plan view of a resistor embodying the present invention and FIG. 4c is a sectional view of a resistor.

Figure 4C:
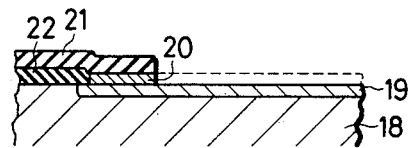

A resistor 15 having such a patterned shape as shown in FIGS. 4a and 4b was formed by an impurity doped layer 19 having a conductivity type different from that of a silicon substrate 18 and having a junction depth of 0.3 μm and a resistivity of $10^{-4} \Omega \cdot cm$ and a $WSi_2$ film (tungsten silicide film) 20 formed on the impurity doped layer 19 and having a thickness of 0.5 to 0.8 μm, as shown in FIG. 4c. The numeral 16 denotes an electrode and the numeral 22 denotes a silicon dioxide film which serves as a mask during formation of the impurity doped layer 19.

Thereafter, an insulating film 21 was formed by a silicon nitride film having a thickness of 0.5 μm and then it was removed in a desired range 17a or 17b by photo-etching.

In this state, an anodic oxidation was performed using the silicon substrate 18 side as anode to oxidize the $WSi_2$ film 20 in the above range 17a or 17b, whereby an oxide film of silicide was formed. Then, the oxide film of silicide was removed using a hydrofluoric acid etchant.

According to this Example, the same resistor which comprises an impurity doped layer having a predetermined shape and a silicide film pattern formed thereon is prepared in advance and then the silicide in the desired region 17a or 17b is removed, whereby a resistor having a desired resistance value can be obtained easily.

EXAMPLE 2

In this Example, a silicide film formed on an insulating film was patterned to a desired shape. This patterning will be explained below with reference to FIGS. 5a and 5b.

Figure 5A:
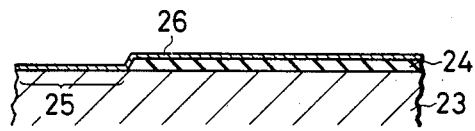

First, as shown in FIG. 5a, an insulating film 24 was formed on a silicon substrate 23 by a silicon dioxide film having a thickness of 0.5 to 0.8 μm, then a desired region 25 of the insulating film 24 was removed with a hydrofluoric acid etchant and thereafter a $WSi_2$ film 26 having a thickness of 100 nm was formed on the whole surface.

Figure 5B:
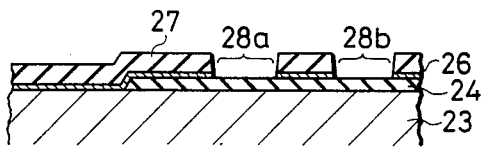

Then, as shown in FIG. 5b, an insulating film 27 having a thickness of 0.5 μm was formed, followed by patterning by a known photo-etching, and thereafter an anodic oxidation was performed using the silicon substrate 23 as anode to oxidize the exposed portion of the $WSi_2$ film 26. Since the resistivity of the oxide film of silicide is low as mentioned above, a large amount of current flows also in the oxidized portion, so the anodic oxidation of the silicide film 24 proceeds not only at a portion 28a close to the portion 25 where the silicide film 26 contacts the silicon substrate but also at a portion 28b located away from the said portion 25. Thereafter, the resultant oxide film of silicide was removed with a hydrofluoric acid etchant (a mixed solution of HF 1:H₂O 10). The etching speed of this oxide film of silicide for the hydrofluoric acid etchant is about the same as that of the anodic oxide film of silicon and it is about 1,000 times as high as the etching speed of the insulating film 24 which has been formed by a silicon dioxide film according to a conventional thermal oxidation process. Thus it is extremely high and therefore the oxide film of silicide formed on the insulating film 24 can be selectively removed by etching with little etching of the film 24.

According to this Example, the silicide film formed on the insulating film can be easily patterned to a desired shape, thereby permitting an easy formation of resistor and interconnection on the insulating film.

EXAMPLE 3

A bipolar transistor was fabricated in this Example. Explanation will be given below with reference to FIGS. 6a to 6e and FIG. 7.

Figure 6A:
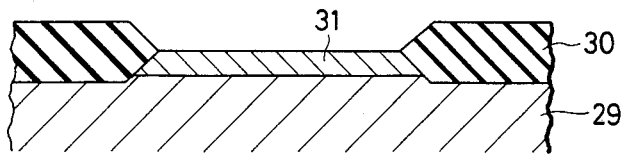

First, as shown in FIG. 6a, a field oxide film 30 having a thickness of 0.8 $\mu$m was formed on an n-type silicon substrate 29 according to a known LOCOS (Local Oxidation of Silicon) process and also formed was a p-type impurity doped layer 31 having a surface carrier concentration of $1 \times 10^{19}/cm^3$ and a junction depth of 0.2 $\mu$m.

Figure 6B:
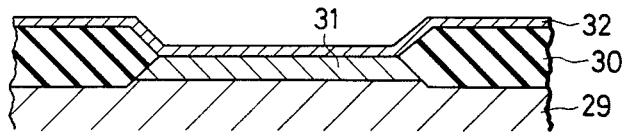

Next, as shown in FIG. 6b, a 0.1 $\mu$m thick WSi₂ film 32 was formed by the CVD process.

Figure 6C:
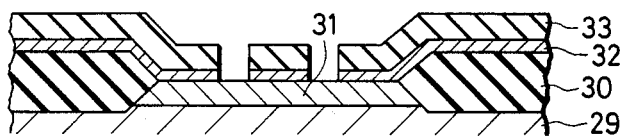

Then, as shown in FIG. 6c, a silicon nitride film 33 having a thickness of 0.1 $\mu$m was formed and then patterned by photo-etching. Next, the exposed portion of the WSi₂ film 32 was selectively oxidized by the foregoing anodic oxidation method and thereafter the resultant oxide film of silicide was removed using a hydrofluoric acid etchant. The silicon nitride film 33 was also removed at the same time.

Figure 6D:
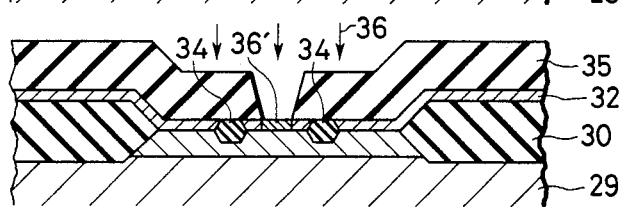

Then, as shown in FIG. 6d, a silicon dioxide film 34 having a thickness of 0.3 $\mu$m was formed by a thermal oxidation process at the portion where the WSi₂ film 32 had been selectively removed. Thereafter, a mask was formed by a photoresist film 35 according to a known photo-etching process and arsenic ion 36 was implanted under the conditions of 140 keV, $1 \times 10^{16}/cm^2$ to form an arsenic-implanted layer 36' in the WSi₂ film 32 of the portion where the resist film 35 was not present.

Figure 6E:
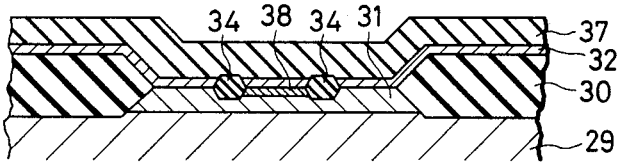

Thereafter, as shown in FIG. 6e, the photoresist film 35 was removed and then a PSG (phosphosilicate glass) film 37 was formed, followed by annealing for 20 seconds in a nitrogen gas atmosphere at 1,100° C. to form an n-type high concentration impurity-doped layer 38 having a surface concentration of $3 \times 10^{20}$ cm$^{-3}$ and a junction depth of 0.1 $\mu$m.

Figure 7:
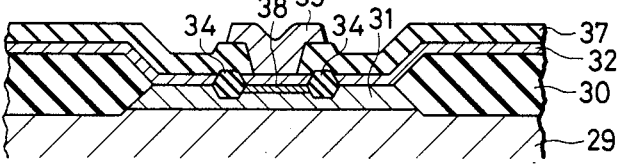

As a modification of this Example, as shown in FIG. 7, a PSG film (concentration 0.5 mol %) 37 having a thickness of 0.3 $\mu$m was processed by photo-etching in place of the photoresist film 35 in FIG. 6d, then the above ion implantation and annealing were performed and thereafter an aluminum electrode 39 was formed directly without removing the PSG film 37.

In this way, by using the p-type impurity doped layer 31 as a base region, the n-type high concentration impurity doped layer 38 as an emitter region, the n-type silicon substrate 29 as a collector region, the WSi₂ film 32 on the p-type impurity doped layer 31 as a base electrode and the WSi₂ film 32 (or the WSi₂ film 32 and aluminum electrode 39) on the n-type high concentration impurity doped layer 38 as an emitter electrode, there can be easily formed a bipolar transistor having electrodes of a low resistance.

Moreover, a transverse diffusion of arsenic in the WSi₂ film 32 is very fast, so even if the masking photoresist film 35 or PSG film 37 somewhat changes in position due to an error in mask alignment, the n-type high concentration impurity doped layer 38 can be formed uniformly at the portion surrounded by the silicon dioxide film 34 and therefore it becomes easier to effect microminiaturization of the transistor.

For example, if the emitter width is 1 $\mu$m, the width of the silicon dioxide film which surrounds the emitter is 0.5 $\mu$m and the size in the perforating step of the photoresist film 35 or PSG film 37 in FIG. 6d or FIG. 7 is 0.5 $\mu$m, it is sufficient for the mask alignment accuracy to be ±0.7 $\mu$m or so.

Thus, the n-type impurity doped layer, i.e., the emitter region, can be formed without being influenced by a slight deviation of the mask. Further, an emitter electrode of a low resistance can be formed easily by going through the step shown in FIG. 7.

Moreover, by ion-implanting boron to only the silicide film 32 on the p-type impurity doped layer 31 followed by annealing, there can be formed a base electrode of a low resistance.

EXAMPLE 4

In this Example there was fabricated a Bi-CMOS LSI with a bipolar transistor and a complementary MOS transistor formed on the same substrate. Explanation will be given below with reference to FIGS. 8a to 8d and FIGS. 9a and 9b.

First, as shown in FIG. 8a, an n-channel MOS transistor I, a p-channel MOS transistor II and an npn bipolar transistor III were formed in a surface region of a silicon substrate 40 according to a known manufacturing method.

In FIG. 8a, the numerals 41, 42 and 43 denote an insulating film for isolation between elements, an n-type well region and a collector, respectively; the numerals 44, 45, 46 and 48 denote insulating films (SiO₂ films); the numerals 47, 49, 50, 51, 52 and 53 denote a gate electrode, a p-type impurity doped region, a base region, an n-type impurity doped region, an emitter and a low resistance region, respectively.

Next, a tungsten film was formed on the whole surface followed by annealing for 60 minutes in a hydrogen gas atmosphere at 750° C. to form WSi₂ films 54a as shown in FIG. 8b, then unreacted tungsten film was removed with an etchant of HCl:HNO₃=1:3.

Then, as shown in FIG. 8c, PSG films 55a were formed, and after patterning by photo-etching, the exposed portions of the WSi₂ films 54a were oxidized according to the anodic oxidation process and the resultant oxide films were removed.

Then, as shown in FIG. 8d, a PSG film 56 was formed and the silicide films 54a were used as electrodes of transistors.

FIGS. 9a and 9b illustrate another embodiment. First, a WSi₂ film 54b was formed throughout the surface on the structure shown in FIG. 8a according to the CVD process as shown in FIG. 9a.

Then, as shown in FIG. 9b, PSG films 55b were formed, and after patterning by photo-etching, the silicide film 54b on the insulating film 41 and also on the silicon substrate 40 was oxidized selectively according to the anodic oxidation process, then the oxide film thereby formed was removed by etching. Thereafter, a PSG film 56 was formed on the whole surface as shown in FIG. 8d.

According to this Example, particularly in an npn transistor, the WSi₂ films on the p-type impurity doped layer 50 and also on the n-type impurity doped layer 52 can be removed selectively at a time, so the isolation of the two impurity doped layers 50 and 52 and the electrode formation on both layers can be done simultaneously.

Although in the above Examples 1 to 4 there was exemplified a WSi₂ film, a tungsten silicide film, as the silicide film, even silicides of other refractory metals, including titanium, are also employable, not to mention molybdenum which is closely similar in chemical properties to tungsten. Desired portions of these many silicides can be removed selectively according to the present invention.

Heretofore, where a silicide film is formed over silicon or silicon dioxide, it has been difficult to remove the silicide film slectively without badly damaging the undercoat silicon or oxide.

On the other hand, according to the present invention, only a desired portion of the silicide film can be removed selectively even when the kind of silicon located below the silicide film is different like n- or p-type layer or poly- or single-crystalline semiconductor. Further, even where the layer below the silicide film is constituted by an insulator on a semiconductor substrate, the silicide film on the insulator can be removed selectively. Therefore, it is possible to easily affect patterning of the silicide film used for electrodes of MOS transistor and bipolar transistor as well as resistors and inteconnections. As a result, the degree of a margin of process increases. Further, in the case of using a silicide film as electrode, it is possible to form an electrode of a low resistance, thereby improving characteristics of a semiconductor device. Thus, the present invention brings about outstanding effects.

What is claimed is:

1. A method of fabricating a semiconductor device, including the steps of selectively anodically oxidizing a film formed of a silicide of a refractory metal so as to form oxides of silicon and of the refractory metal selectively from said film, the portion of said film in which said oxides are formed constituting a film portion of said film, said film portion being a portion of the film to be selectively removed, and then etching said film portion so as to completely remove said oxides of silicon and of the refractory metal, to thereby completely remove said film portion of the silicide film selectively.

2. A method according to claim 1, wherein said silicide film is formed on silicon.

3. A method according to claim 2, wherein said silicon is a single-crystalline silicon substrate.

4. A method according to claim 1, wherein said silicide film is formed on a silicon dioxide film.

5. A method according to claim 1, wherein said anodic oxidation is performed at a constant current.

6. A method according to claim 1, wherein said film of a silicide of a refractory metal is located on a substrate, which substrate, at a constant current, is anodically oxidized at a relatively greater voltage than the voltage at which the silicide is anodically oxidized at the same constant current; and wherein anodic oxidation is stopped at the time of a sudden rise of the voltage, whereby anodic oxidation can be stopped after anodically oxidizing the film portion of the silicide film but before anodically oxidizing the substrate, so that during the etching substantially only the film portion, and not the substrate or the remainder of the silicide film other than the film portion, is removed.

7. A method according to claim 1, wherein said refractory metal is selected from the group consisting of tungsten, molybdenum and titanium.

8. A method according to claim 1, wherein said etching is performed by wet etching.

9. A method according to claim 8, wherein said wet etching is performed using a hydrofluoric acid etchant.

10. A method according to claim 9, wherein said hydrofluoric acid etchant is an aqueous hydrofluoric acid solution.

11. A method according to claim 1, wherein the anodic oxidation forms porous oxides of silicon and of the refractory metal, whereby the oxides can easily be removed by etching as compared with removal by etching of oxides formed by thermal oxidation of the silicide of the refractory metal.

12. A method according to claim 1, wherein said film of a silicide of a refractory metal is located on a substrate, and wherein said etching is performed using an etchant that selectively etches the oxides of silicon and of the refractory metal without any substantial etching of the material of the substrate or the silicide of a refractory metal, whereby said film portion can be completely removed selectively without substantial etching of the substrate or the remainder of the film other than the film portion.

13. A method according to claim 12, wherein said substrate, at a constant current, is anodically oxidized at a relatively greater voltage than the voltage at which the silicide is anodically oxidized at the same constant current; and wherein anodic oxidation is stopped at the time of a sudden rise of the voltage, whereby anodic oxidation can be stopped after anodically oxidizing the film portion of the silicide film but before anodically oxidizing the substrate, so that during the etching substantially only the film portion, and not the substrate or the remainder of the silicide film other than the film portion, is removed.

* * * * *